(12) United States Patent
Nardini et al.

(10) Patent No.: US 9,702,935 B2
(45) Date of Patent: Jul. 11, 2017

(54) PACKET BASED INTEGRATED CIRCUIT TESTING

(71) Applicant: TEXAS INSTRUMENTS INCORPORATED, Dallas, TX (US)

(72) Inventors: Lewis Nardini, Richardson, TX (US); Sumant Kale, Allen, TX (US); Alan Hales, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 130 days.

(21) Appl. No.: 14/473,380

(22) Filed: Aug. 29, 2014

(65) Prior Publication Data

US 2015/0067426 A1  Mar. 5, 2015

Related U.S. Application Data (60) Provisional application No. 61/871,409, filed on Aug. 29, 2013.

(51) Int. Cl.
*G06F 11/00* (2006.01)
*G01R 31/3185* (2006.01)
*G01R 31/3183* (2006.01)

(52) U.S. Cl.
CPC ............... *G01R 31/318547* (2013.01); *G01R 31/318385* (2013.01); *G01R 31/318575* (2013.01)

(58) Field of Classification Search
CPC .... G06F 31/318547; G01R 31/318536; G01R 31/318541; G01R 31/318555
See application file for complete search history.

(56) References Cited

U.S. PATENT DOCUMENTS

| | | | | | |
|---|---|---|---|---|---|
| 5,828,824 | A | * | 10/1998 | Swoboda | G01R 31/31857 714/25 |
| 6,446,230 | B1 | * | 9/2002 | Chung | G01R 31/31855 714/726 |
| 6,744,274 | B1 | * | 6/2004 | Arnold | G01R 31/31724 326/16 |
| 6,867,613 | B1 | * | 3/2005 | Bienek | G01R 31/3016 324/750.3 |
| 7,239,973 | B2 | * | 7/2007 | Schahl | H04N 17/04 235/492 |
| 7,290,188 | B1 | * | 10/2007 | Peterson | G01R 31/31727 714/724 |
| 8,065,572 | B2 | * | 11/2011 | Ziaja | G01R 31/31854 714/718 |
| 8,248,073 | B2 | * | 8/2012 | Inoue | G01R 31/31723 324/300 |
| 8,726,112 | B2 | * | 5/2014 | Rajski | 714/731 |
| 2012/0324302 | A1 | * | 12/2012 | Arslan | G01R 31/31857 714/727 |

* cited by examiner

*Primary Examiner* — Esaw Abraham
(74) *Attorney, Agent, or Firm* — Ronald O. Neerings; Charles A. Brill; Frank D. Cimino (57) ABSTRACT

Apparatus and method for testing an integrated circuit. An integrated circuit includes circuitry to be tested, scan chain logic, and a test adapter. The scan chain logic is configured to transfer test data to and test results from the circuitry. The test adapter is configured to extract the test data from a packet received from an automated test control system and to transfer the test data to the scan chain logic. The test adapter is also configured to receive the test results from the scan chain logic, and to packetize the test result for transmission to the automated test control system.

20 Claims, 6 Drawing Sheets

PACKET BASED INTEGRATED CIRCUIT TESTING

CROSS-REFERENCE TO RELATED APPLICATIONS

The present application claims priority to U.S. Provisional Patent Application No. 61/871,409, filed Aug. 29, 2013; which is hereby incorporated herein by reference in its entirely.

BACKGROUND

The number of transistors provided in integrated systems (i.e., system-on-chip (SOC)) continues to increase. Automated Test Equipment (ATE) is applied to screen these increasingly large SOCs for manufacturing defects. As SOC size increases more time is required for ATE to achieve test coverage meeting specified device quality goals (DPPM: Defective-Parts-Per-Million). Additional test time adds to the test cost of each device. Due to additional test cost, the cost to produce the device increases, which results in an increase in average-selling-price and/or reduction in profit.

SUMMARY

A test adapter for testing an integrated circuit is disclosed herein. In one embodiment, an integrated circuit includes circuitry to be tested, scan chain logic, and a test adapter. The scan chain logic is configured to transfer test data to, and test results from, the circuitry. The test adapter is configured to extract the test data from a packet received from an automated test control system, and to transfer the test data to the scan chain logic. The test adapter is also configured to receive the test results from the scan chain logic, and to packetize the test results for transmission to the automated test control system.

In another embodiment, a method for testing an integrated circuit includes receiving, by the integrated circuit, a packet containing test data for testing the integrated circuit. The test data is extracted from the packet by a test adapter of the integrated circuit. The extracted test data is transferred to scan chain logic of the integrated circuit by the test adapter. Test results received from the scan chain logic are packetized by the test adapter for transmission to an automated test control system.

In a further embodiment, a test adapter for testing an integrated circuit includes a physical layer (PHY) unit, a media access control (MAC) unit, and a control and data unit. The PHY unit is configured to receive deserialized test data from a serializer/deserializer (SERDES); to descramble the received test data; to apply error correction to the received test data; and to frame the received test data. The MAC unit is coupled to the PHY unit, and is configured to decode packets of the received test data. The control and data unit is coupled to the MAC unit, and is configured to: interpret control information embedded in the decoded test data; and to route the test data within the integrated circuit based on the control information.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection. The recitation "based on" is intended to mean "based at least in part on." Therefore, if X is based on Y, X may be based on Y and any number of additional factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Conventional Automated Test Equipment (ATE) used to test integrated systems (i.e., System On Chip (SOC)) uses a low bandwidth cycle-by-cycle parallel interface to deliver the test data, and the bandwidth of the interface is often limited by the capabilities of the ATE rather than the ability of the device under test (DUT) to consume the test data and perform the test. Accordingly, integrated circuit test time and cost is often limited by the capabilities of conventional ATE systems.

Embodiments of the present disclosure include an integrated circuit test adapter that can reduce circuit test time and cost. The test adapter receives test data packets via a high-speed serial interface, decodes and interprets the test packets, and routes test data in an integrated circuit in accordance with control information provided in the test data packet. Similarly, the test adapter receives test results from a scan chain of the integrated circuit, encodes and packetizes the test results, and transmits the test results packets to a tester via the high-speed serial interface. In some embodiments, the high-speed serial interface may be shared other systems of the integrated circuit.

Figure 1:
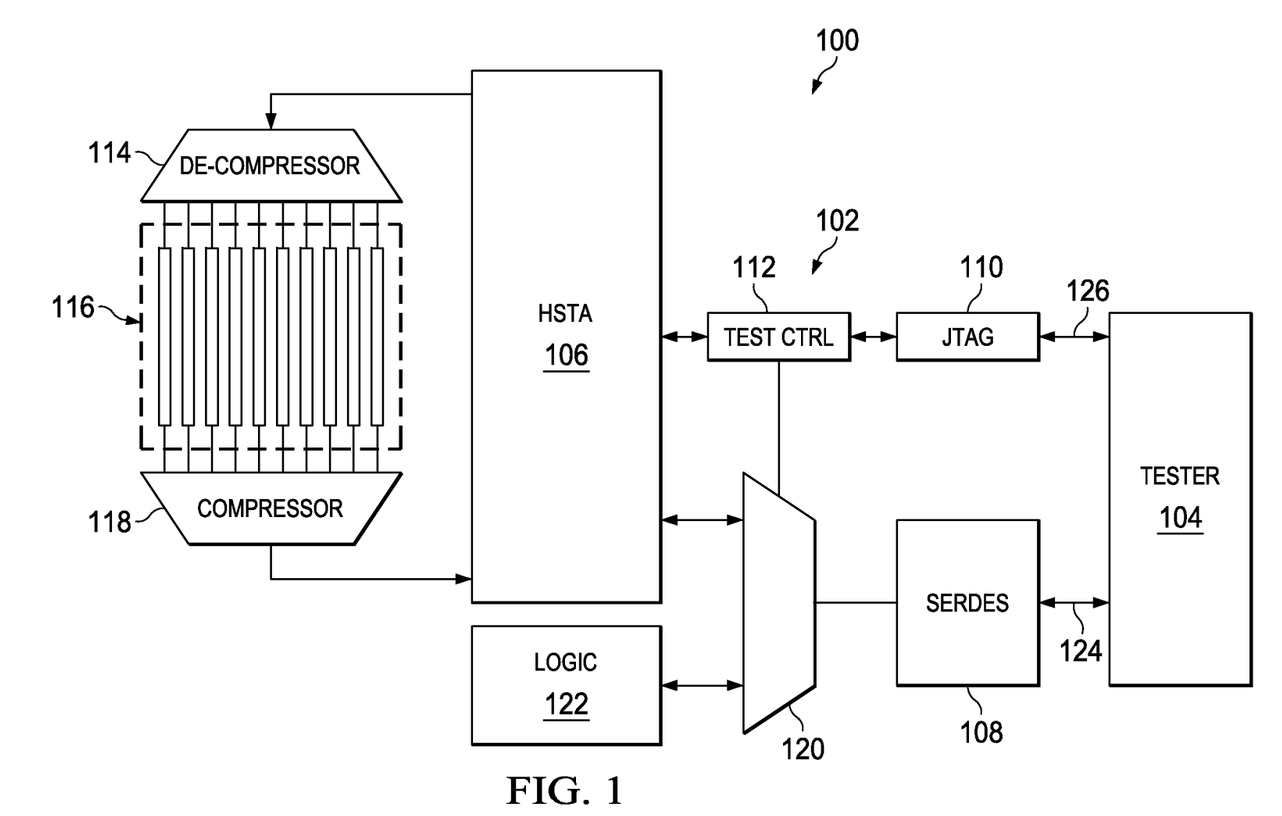
FIG. 1 shows a block diagram of a system for testing an integrated circuit in accordance with various embodiments.

FIG. 1 shows a block diagram of a system 100 for testing an integrated circuit in accordance with various embodiments. The system 100 includes an integrated circuit 102 and a tester 104. The tester 104 may control operation of test circuitry on the integrated circuit 102, provide packets of test data to the integrated circuit 102, and/or process and analyze results of testing provided by the integrated circuit 102. In some embodiments, the tester 104 may include a computer that provides control functions, test data sourcing, and/or test result analysis. The tester 104 is coupled to the integrated circuit 102 via a high-speed serial link 124 and a control link 126. The control link 126 may be in accordance with IEEE 1149.1 Standard Test Access Port, also referred to as the Joint Test Action Group (JTAG) test interface standard.

The high speed serial link 124 may be in accordance with the Universal Serial Bus standard, IEEE 1394 serial bus standard, Peripheral Component Interconnect Express, etc., or other high-speed serial interconnect specification. In some embodiments, the high-speed serial link 124 may be capable of providing test data to the integrated circuit at a rate of at least 3.25 giga-bits per second to reduce test time. Some embodiments may include multiple high speed serial links 124, and some embodiments of the high speed serial link 124 may provide transfer rates of 10 giga-bits per second or higher.

The integrated circuit 102 includes a JTAG port 110, a serializer/deserializer (SERDES) 108, a test controller 112, a high-speed serial test adapter (HSTA), a decompressor, 114, a compressor 118, scan chains 116, and other circuit logic 122. Various components of the integrated circuit 102, such as transceivers, clock generators, etc. have been omitted to promote clarity. The JTAG port 110 receives control information from the tester 104, and provides the control information to the test controller 112. Status information received from the test controller 112 may be provided to the tester 104 via the JTAG port 110. The test controller 112 provides control signals to and receives status from the HSTA 106.

The SERDES 108 deserializes the packetized serial test data received from the tester 104, and serializes test results for transmission to the tester 108. The SERDES 108 is coupled to routing logic 120. The routing logic 120 may include a demultiplexer that selectively routes signals received from the SERDES 108 to the HSTA or the logic 112. The routing logic 120 may also include a multiplexer that selectively routes signals received from the HSTA 106 or the logic 122 to the SERDES 108. The logic 122 is functional interface logic that shares the SERDES 108 with the HSTA 106. Thus, embodiments of the integrated circuit 102 may apply the SERDES 108 for communication between the HSTA 106 and the tester 104, and may also apply the SERDES for communication between the logic 122 and a device external to the integrated circuit 102. The SERDES may serialize and/or deserialize data transferred at a rate of 3.25 giga-bits per second or higher.

The HSTA 106 receives test data packets from the SERDES 108, processes the test data packets, and provides test data extracted from the packets to the scan chains 116, or to other test circuitry of the integrated circuit 102. Similarly, the HSTA 106 receives test results from the scan chains 116, packetizes the test results, and passes the packetized test results to the SERDES 108 for transmission to the tester 104.

The decompressor 114 receives compressed test data from the HSTA 106, reverses data reduction processing applied to the test data prior to transmission by the tester 104, and provides the decompressed test data to the scan chains 116. As the test data propagates through the scan chains 116, circuitry of the integrated circuit 102 manipulates the test data, and produces test results that are loaded into the scan chains 116. The compressor 118 receives the test results from the scan chains 116, applies data reduction to the test results, and provides the compressed test results to the HSTA 106. The compressor 118 and decompressor 114 may be omitted from some embodiments of the integrated circuit 102.

By applying packetized test data received via the high-speed serial link 124, the HSTA 106 can test the integrated circuit 102 at a substantially higher rate than is possible with conventional ATE systems, thereby reducing test time and overall circuit production cost.

Some embodiments of the system 100 may also apply the HSTA 106, the SERDES 108, and associated components to provide for testing of the integrated circuit 102 that does not involve the scan chains 116. For example, the HSTA 106 may provide data for functional testing of the integrated circuit, memory testing, etc. that does not employ the scan chains 116 but uses a large amount of data that can be transferred in a timely fashion via the HSTA 106.

Figure 2A:
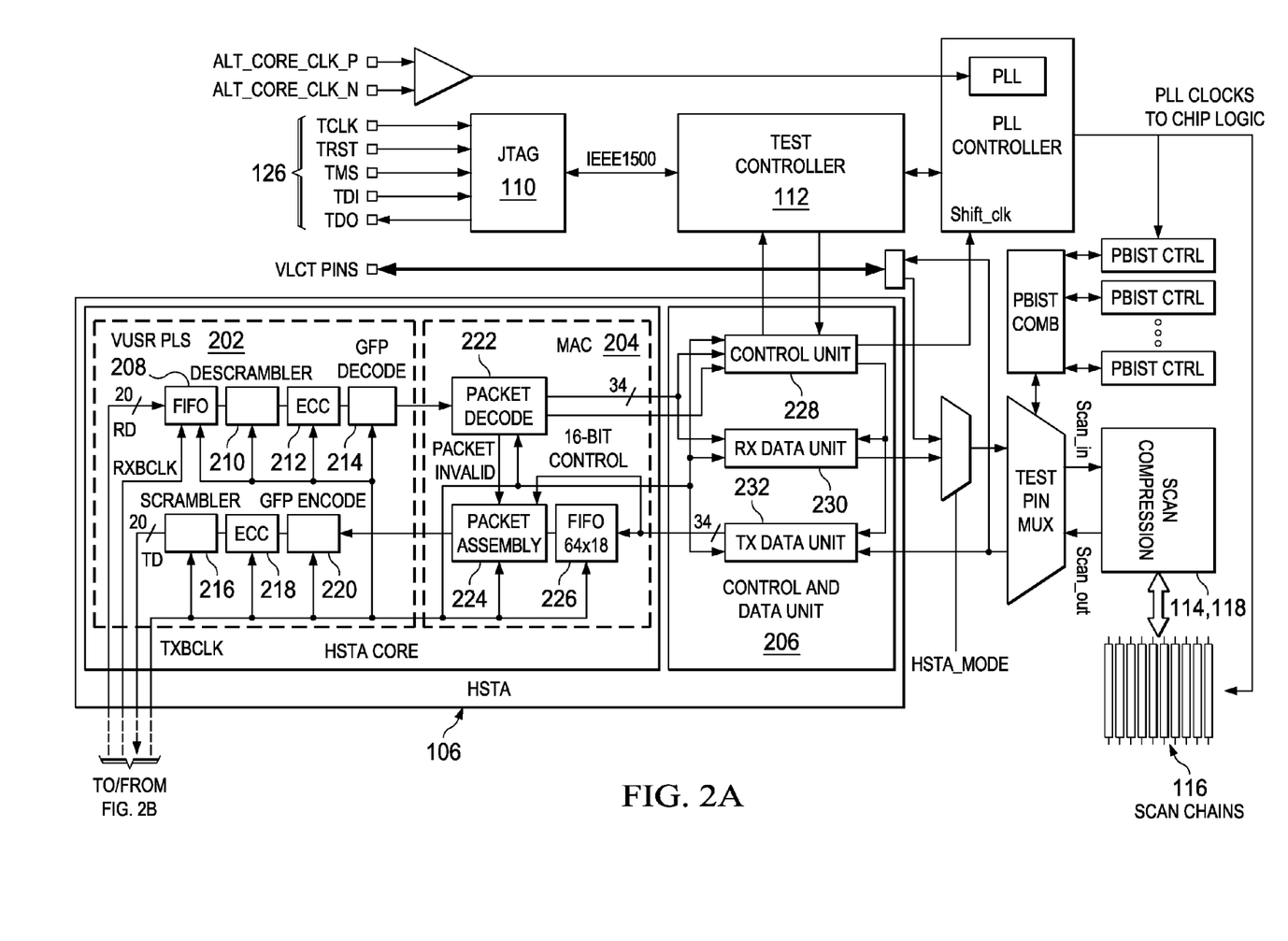
FIGS. 2A and 2B show a block diagram of an integrated circuit that includes automated test circuitry in accordance with various embodiments.
Figure 2B:
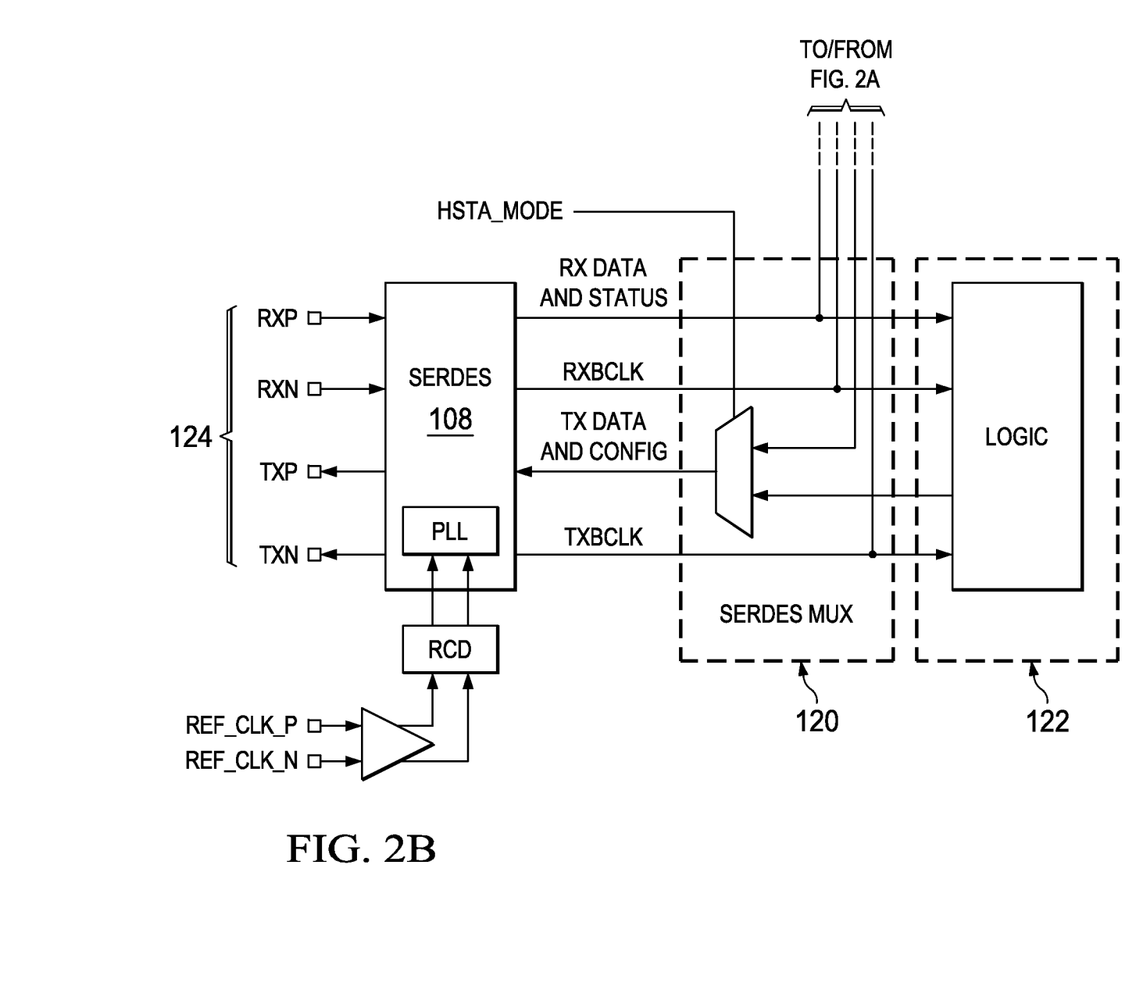

FIGS. 2A and 2B show a more detailed block diagram of the integrated circuit 102. The SERDES 108, SERDES routing logic 108, HSTA 106, JTAG port 110, test controller 112, scan chains 116, etc. are connected as described with regard to FIG. 1. The HSTA 106 includes physical layer logic (PHY) 202, medium access control (MAC) logic 204, and a control and data unit 206.

The PHY 202 includes first-in-first-out memory (FIFO) 208, descrambler 210, error correction decoder 212, GFP decoder 214, GFP encoder 220, error correction encoder 218, and scrambler 216. The MAC 204 includes packet decoder 222, FIFO 226, and packet assembler 224. The control and data unit 206 includes control unit 228, receive (RX) data unit 220, and transmit (TX) data unit 232.

The PHY 202 may support a plurality of lanes (e.g., up to four lanes). For data transmission, the PHY 202 encodes transmit data received from the MAC 204 using a generic framing procedure (GFP) (e.g., 32/33 encoding that encodes 4 bytes and control flags into 33 bits of GFP encoded data), adds an error correction code (ECC) (e.g., 9 bits that protect 144 bits of data in a 4 symbol block), and scrambles the data to ensure high transition density prior to sending the data to the SERDES 108. For reception, the PHY 202 aligns the serial bit stream (e.g., to a 36 bit symbol boundary), identifies synchronizing codes, descrambles the data, aligns the data to the ECC boundaries (e.g., aligns four 36 bit symbols to ECC alignment boundary), performs the ECC correction, decodes the data using GFP 33/32 (e.g., decodes control codes and swaps data into correct byte lanes), and presents the GFP decoded data to the MAC 204.

The MAC 204 provides packet decoding, packet assembly and flow control. For data reception, the MAC 204 decodes incoming packets, extracts the control and data from the packets, and forwards the control and data to the control and data unit 206. Test results received from the control and data unit 206 are collected in the transmit FIFO 226 of the MAC 204. The transmit FIFO 226 may be large enough to hold one and half packets worth of test results or other data. The MAC 204 packetizes the test results and provides the packetized results to the PHY 202 for transmission.

The control and data unit 206 generates control signals and routes test data to selected destinations. Control data extracted from a received packet provides information about the payload type of the packet. Based on the information the control and data unit 206 routes data to the proper destination. For example: if the type of data in a received packet is determined to be scan-shift-data, then the packet data will be routed to the scan chains 116. If a packet is for a Transition Fault Test (TFT) capture then the control and data unit 206 will send a capture enable signal to the phase locked loop (PLL) controller that controls provision of clocks to the integrated circuit. Table 1 below shows examples of various control values extracted from a received packet and routing/control provided by the control and data unit 206 responsive the control value.

TABLE 1

HSTA Control Words and Routing

| Control Word [15:0] | Packet/Data Type | Description | Destination |
|---|---|---|---|
| 0000-0000-0000-0000 | Invalid | Invalid Packet | None |
| 1000-0000-0000-0000 | Return Address Counter Reset | Packet causes MAC to reset the address counter so that memory space can be overwritten with new data. | Internal to MAC |
| 1000-0000-0000-0001 | HSTA Loop-back | The packet data will be looped back to transmit in order to test HSTA link/logic. | Loop-back |
| 1100-0000-0000-0001 | ATPG Control | This packet will provide control signals that need to be changed during test pattern execution. | Test controls to various modules like DFTSS, PLL ctrl. |
| 0001-0000-0000-0010 | ATPG Scan Shift | Scan shift data for ATPG. | Scan chains through Test Pin Mux |
| 0001-0000-0000-0011 | ATPG SA Scan Capture | Scan capture for stuck-at ATPG. | Capture clock pulse to PLL Ctrl |
| 0001-0000-0001-0010 | ATPG TFT Scan Capture | Scan capture for TFT ATPG. | Capture enable to PLL Ctrl |
| 01xx-xxxx-xxxx-xxxx | Reserved | Reserved | Reserved |

Return Address Counter Reset resets the memory start address for outgoing packets.

HSTA Loop-back causes the control and data unit 206 to loop the packet data back and send the packet to the tester 104. This packet type is used to test operation of the HSTA 106, and to ensure that the link 124 and HSTA 106 are working properly prior to testing of the integrated circuit 102.

ATPG Control provides values for control signals to be changed during pattern execution. For example: partition enables, module selects etc. A first 16-bit word of the packet may represent an address/destination of the control data, and remaining words of the packet may provide the actual values for the control signals assigned for the address.

ATPG Scan Shift includes scan shift data for all ATPG modes (e.g., plain scan, compression, stuck-at, TFT etc.) For this type of packet, the control and data unit 206 issues one clock cycle for every valid data value. Data is synchronous to the clock, so the clock can be used directly as a shift clock for the scan chains.

For ATPG Stuck at Scan Capture, behavior of the clock is similar to ATPG Scan Shift. For example, a clock pulse will be issues when byte enables for test data transfer are valid. However, the data values will not change, but will maintain at the previous value.

For ATPG TFT Capture, the control and data unit 206 does not issue any clock cycles; instead the control and data unit 206 triggers the at-speed capture sequence from PLL controller.

Figure 3:
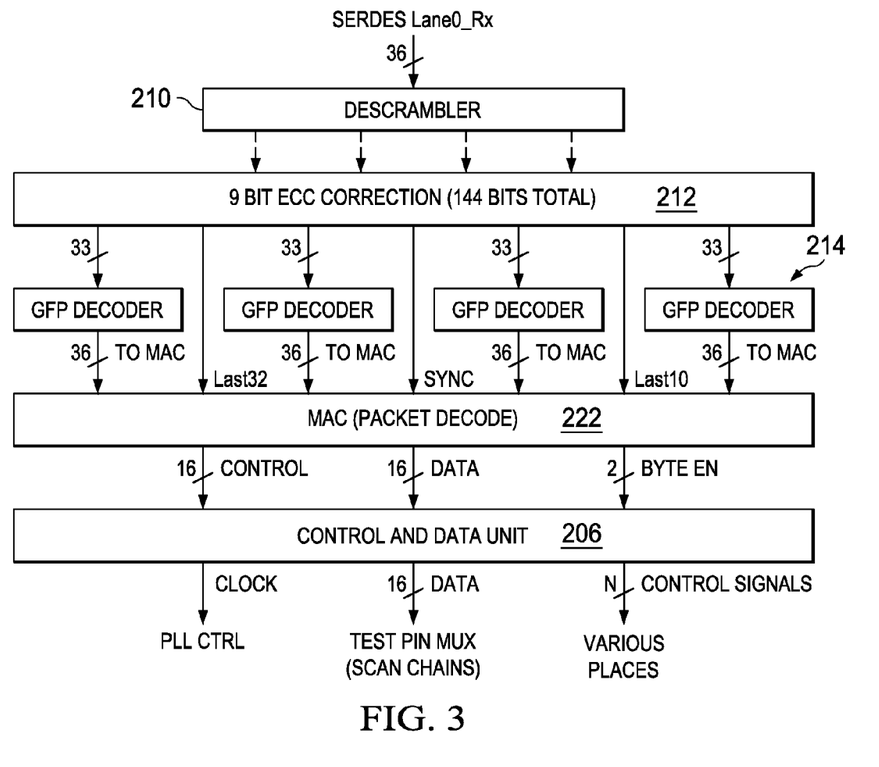
FIG. 3 shows a block diagram of test data processing in accordance with various embodiments.

Operations performed as part of serial test data reception are shown in FIG. 3 in conjunction with FIGS. 2A and 2B. Test data packets deserialized by the SERDES 108 are routed to the PHY 202 via the routing logic 120, and stored in the FIFO 208. In some embodiments, the test data is provided to the PHY 202 in segments of 36-bit words.

The PHY 202 may include a state machine that determines when the SERDES 108 serial data is aligned. When the SERDES 108 completes the alignment, the SERDES 108 may signal the PHY 202 that the SERDES 108 is synchronized. The PHY 202 detects the comma signal (K28.5) and extracts the lane number for future lane alignment operations. The state machine may also lock the ECC block boundary to the lane offset such that a complete 144 bit word is received.

To allow the use of up to 16 control codes, a GFP encoding scheme is used. The decoding of the GFP 32/33 code may present four bytes along with a data flag per byte to the MAC 204. Also encoded in the packet is the last and block sync code.

The test data is scrambled by the tester 104 to ensure high transition density. The descrambler 210 reads the test data from the FIFO 208 and reverses the scrambling performed by the tester 104.

The error correction decoder 212 is coupled to the descrambler 210. The error correction decoder 212 checks the descrambled test data for errors and may correct any detected errors in accordance with the forward error correction coding applied to the test data by the tester 104. In some embodiments, four 36-bit descrambled words of test data are associated for error correction. In some embodiments, the error correction decoder may apply a binary hamming code that allows correction of single bit errors and detection of double bit errors.

The GFP decoder 214 is coupled to the error correction decoder 212. The GFP decoder 214 applies a generic framing procedure to the error corrected test data. The GFP decoder 214 may apply 32b33b decoding to the error corrected test data.

Data output by the GFP decoder 214 is provided to the MAC 204. The data may include four 32-bit wide (4 byte) words along with four byte enables. The MAC 204 decodes the packet and extracts various fields from the packet. The MAC 204 may extract a control word (e.g., a 16-bit control word) from a header of the packet and route the control word onto a control bus. The MAC 204 may divide the payload/data of the packet into chunks of 16-bit words and pass the words to the control & data unit 206 along with two byte enables. The control word may remain constant for each packet.

The control and data unit 206 decodes the control word, identifies the packet type and routes control and data signals and clock to the respective destinations signified by the control word. For example, scan data is routed to the scan chains 116 for testing circuitry of the integrated circuit 102.

Figure 4:
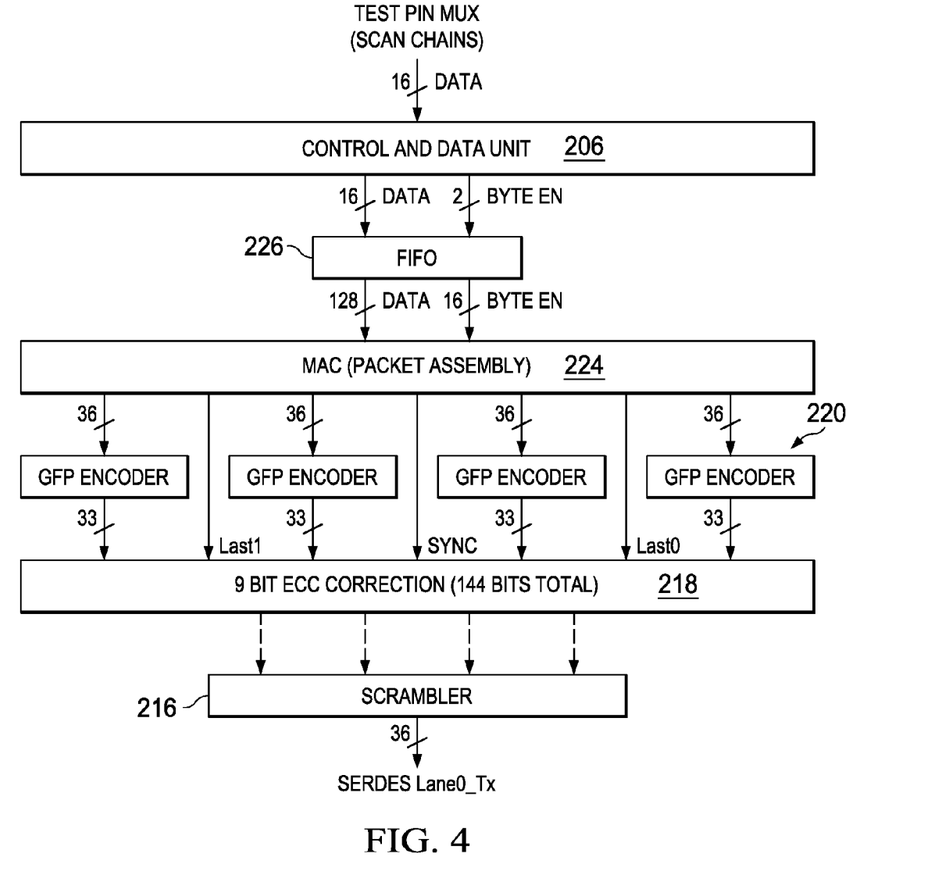
FIG. 4 shows a block diagram of test result processing in accordance with various embodiments.

Operations performed as part of serial test result transmission are shown in FIG. 4 in conjunction with FIGS. 2A and 2B. Test results, and/or other data to be transmitted to the tester 104, are received from the scan chains 116, and/or other data sources in the integrated circuit 102, by the TX data unit 232 of the control and data unit 206. If the data is 8-bit wide only, then the TX data unit 232 adds 8 bits of padding and may disable byte-enable for the added 8-bits.

The TX data unit 232 passes the received data to the MAC 204 where the data is stored in FIFO 226. The packet assembly logic 224 of the MAC 204 reads the data from the FIFO 226, attaches header information to the data, and creates a packet (i.e., packetizes the data). The MAC 204 passes the packetized data to the PHY 202 in the form of four 36-bit wide words. In the PHY 202, GFP encoder 220 GFP encodes the 36-bit wide words and passes the encoded words to the ECC encoder 218. The ECC encoder 218 attaches an ECC code (e.g., 9-bit code) to the GFP encoded data and passes the data to the scrambler 216 (e.g., in four 36-bit wide words). The scrambler 216 scrambles the data to ensure high transition density. From the scrambler 216, the data is routed to the SERDES via the routing logic 120, serialized, and transmitted to the tester 104.

Figure 5:
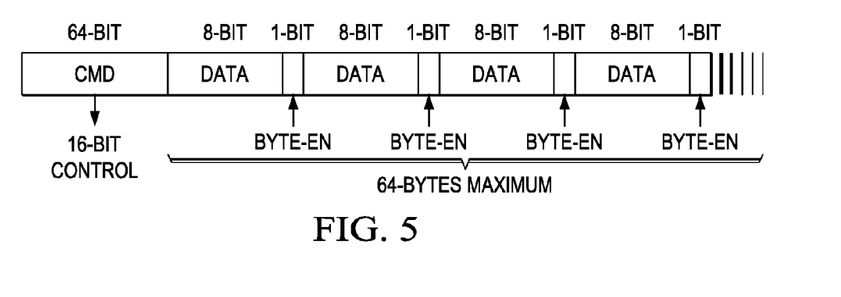
FIG. 5 shows a format of a test data packet in accordance with various embodiments.

FIG. 5 shows the format of a test data packet 500 in accordance with various embodiments. The test data packet 500 may be suitable for use in the system 100 and the HSTA 106. The test data packet 500 includes a header (e.g., a 64-bit header) and a plurality of bytes (e.g., up to 64 bytes) of data payload. Each byte of payload is associated with a byte enable that indicates whether or not the byte is valid. The header includes control information (e.g., the 16-bit control word described herein) that directs the use and routing of the packet by the HSTA 106. The header may also include addressing information for packet data, command information, etc.

Figure 6:
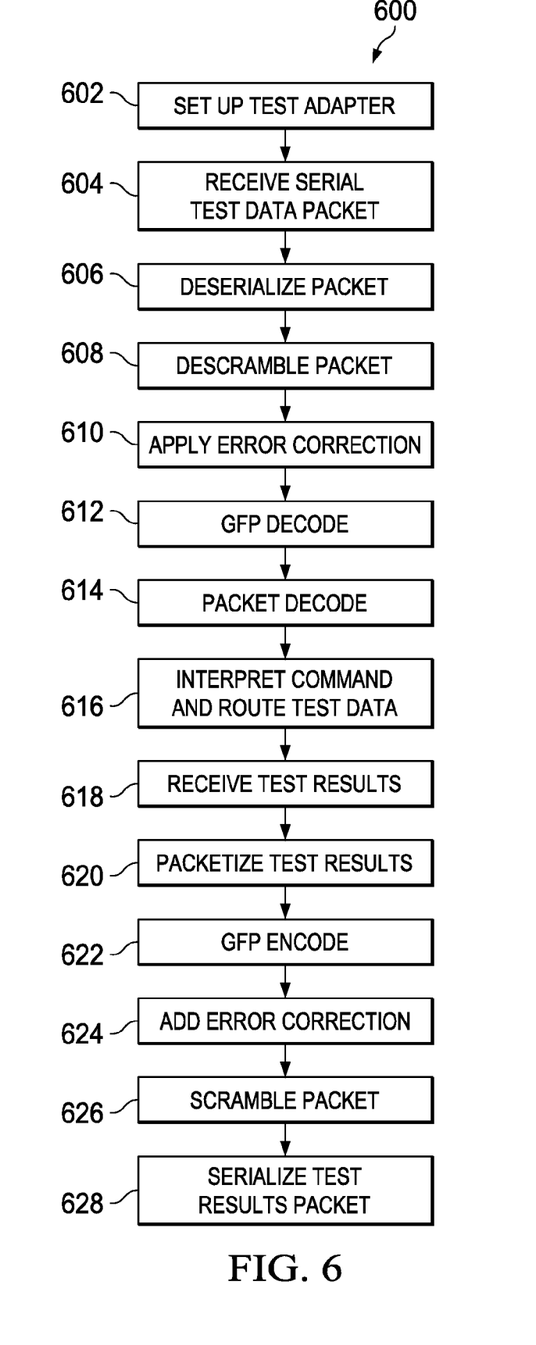
FIG. 6 shows a flow diagram for a method for testing an integrated circuit in accordance with various embodiments.

FIG. 6 shows a flow diagram for a method 600 for testing an integrated circuit in accordance with various embodiments. Though depicted sequentially as a matter of convenience, at least some of the actions shown can be performed in a different order and/or performed in parallel. Additionally, some embodiments may perform only some of the actions shown.

In block 602, the tester 104 initializes the integrated circuit 102 for testing. The tester 104 may transfer control information to the integrated circuit 102 via the control link 126. The control information causes the test controller 112 to communicate with the control unit 228 of the control and data unit 206. The test controller 112 notifies the HSTA 106 of the imminent testing, and prepares the HSTA 106 for reception of test data and communication via the high speed serial link 124.

In block 604, the tester 104 transfers a packet of test data to the integrated circuit 102 via the high speed serial link 124. The integrated circuit 102 receives the serial data packet, and the SERDES 108 deserializes the received data packet in block 606.

The routing logic 120 directs the deserialized data packet from the SERDES 108 to the HSTA 106. The descrambler 210 descrambles the data received from the SERDES 108 in block 608.

In block 610, the ECC decoder 212 detects and corrects errors in the descrambled data. The GFP decoder 214 frames the error corrected data in block 612.

In block 614, the packet decoder 222 of the MAC 204 decodes the received packet, extracts control information and data from the packet, and passes the control information and data (e.g., test data) to the control and data unit 206.

In block 616, the control unit 228 of the control and data unit 206 interprets the command information received from the MAC 204, and the RX data unit 220 routes the data in accordance with the command information. For example, the RX data unit 220 may route the data to the scan chains 116 for use in testing circuitry of the integrated circuit 102.

In block 618, the results of testing the integrated circuit with the test data introduced to the scan chains 116 is read from the scan chains 116 by the TX data unit 232 of the control and data unit 206. The TX data unit 232 transfers the test results to the MAC 204 in block 620, and the packet assembler 224 packetizes the test results.

In block 622, the MAC 204 transfers the packetized test results to the PHY 202, and the GFP encoder 220 applies GFP encoding to the test results. The error correction coder 218 applies error correction encoding to the GFP encoded data in block 624.

In block 626, the scrambler 216 scrambles the error correction encoded test results. The scrambled test results are transferred to the SERDES 108 via the routing logic 120. The SERDES 108 serializes the test results in block 628, and the test results are transmitted to the tester 104 via the high-speed serial link 124.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
   circuitry to he tested;
   scan chain logic configured to transfer test data to and test results from the circuitry; and
   a test adapter configured to:
      extract the test data from a packet received from an automated test control system;
      transfer the test data to the scan chain logic;
      receive the test results from the scan chain logic, and packetize the test results for transmission to the automated test control system.

2. An integrated circuit, comprising:
   circuitry to be tested;
   scan chain logic configured to transfer test data to and test results from the circuitry: and
   a test adapter configured to:
      extract the test data from a packet received from an automated test control System;
      transfer the test data to the scan chain logic;
      receive the test results from the scan chain logic, and packetize the test results for transmission to the automated test control system; and
   wherein the test adapter comprises:
      a physical layer (PHY) unit configured to:
         descramble received test data;
         apply error correction to the received test data;
         frame the received test data;
         frame the result data to be transmitted;
         add error correction to the result data; and
         scramble the result data;
      a media access control (MAC) unit coupled to the PHY unit, and configured to:
         decode the received test data;
         packetize the received test results; and
         encode the test results;
      a control and data unit coupled to the MAC unit, and configured to:
         interpret control information embedded in the decoded test data; and
         route the test data within the integrated circuit based on the control information.

3. The integrated circuit of claim 1, further comprising a serializer/deserializer (SERDES) coupled to the test adapter, the SERDES configured to:

deserialize serialized test data packets received at an input port of the integrated circuit, and
serialize test results received from the test adapter.

4. The integrated circuit of claim 2, wherein the control and data unit is configured to interpret the control information as identifying a packet of the test data as specifying at least one of;
a return address counter reset command;
a test adapter loop back command;
a control value command;
an automated test pattern generation (ATPD) shift command;
an ATPG stuck at capture command; and
are ATPG TFT capture command.

5. An integrated circuit, comprising:
circuitry to be tested;
scan chain logic configured to transfer test data to and results from the circuitry:
a test adapter configured to:
   extract the test data from a packet received from an automated test control System:
   transfer the test data to the scan chain logic:
   receive the test results from the scan chain logic, and
   packetize the test results for transmission to the automated test control system:
a serializer/deserializer (SERDES) coupled to the test adapter, the SERDES
configured to:
   deserialize serialized test data packets received at an input port of the integrated circuit, and
   serialize test results received from the test adapter: and
wherein the SERDES is configured to receive serial test data at a rate of at least 3.25 gigabits per second.

6. An integrated circuit, comprising:
circuitry to be tested:
scan chain logic configured to transfer test data to and test results from the circuitry;
a test adapter configured to:
   extract the test data from a packet received from an automated test control system;
   transfer the test date to the scan chain logic;
   receive the test results from the scan chain logic, and
   packetize the test results for transmission to the automated test control system;
a serializer/deserializer (SERDES) coupled to the test adapter, the SERDES configured to;
   deserialize serialized test data packets received at an input port the integrated circuit, and
   serialize test results received from the test adapter; and
routing logic coupled to the SERDES, the routing logic configured to switchably route data to/from the SERDES and the test adapter, and to/from the SERDES and logic of the integrated circuitry coupled to the SERDES in parallel with the test adapter.

7. An integrated circuit, comprising:
circuitry to be tested;
scan chain logic configured to transfer test data to and test results from the circuitry;
a test adapter configured to;
   extract the test data from a packet received from an automated test control system;
   transfer the test data to the scan chain logic;
   receive the test results from the scan chain logic, and
   packetize the test results for transmission to the automated test control system;
a serializer/deserializer (SERDES) coupled to the test adapter, the SERDES configured to:
   deserialize serialized test data packets received at an input port of the integrated circuit, and
   serialize test results received from the test adapter; and
a test controller coupled to the test adapter, the test controller configured to communicate with the test adapter via a communication channel other than that provided through the SERDES.

8. A method for testing an integrated circuit, comprising:
receiving, by the integrated circuit, a packet containing test data for testing the integrated circuit;
extracting, by a test adapter of the integrated circuit, the test data from the packet;
transferring, by the test adapter, the extracted test data to scan chain logic of the integrated circuit; and
packetizing, by the test adapter, test results received from the scan chain logic for transmission to an automated test control system.

9. The method of claim 8, further comprising;
deserializing, by a serializer/deserializer (SERDES) of the integrated circuit, packetized test data received at an input port of the integrated circuit; and
serializing, by the SERDS, packetized test results for transmission to an automated test control system.

10. A method for testing an integrated circuit, comprising:
receiving, by the integrated circuit, a packet containing test data for testing the integrateded circuit;
extracting,by a test adapter of the integrated circuit, the test data from the packet;
transferring, by the test adapter,the extracted test data to scan chain logic of the integrated circuit;
packetizing ,by the test adapter,test results received from the scan chain logic for transmission to an automated test control system;
wherein extracting the test data comprises:
   descrambling received test data;
   error correcting the received test data;
   framing the received test data;
   decoding the received test data; and
   interpreting control information embedded in the decoded test data; and
wherein packetizing the test results data comprises:
   framing the result data to be transmitted;
   adding error correction to the result data; and
   scrambling the result data.

11. The method of claim 10 wherein the interpreting comprises identifying a packet of the test data as specifying at least one of;
a return address counter reset command;
a test adapter loop back command;
a control value command;
an automated test pattern generation (ATPG) shift command;
an ATPG stuck at capture command; and
an ATPG TFT capture command.

12. The method of claim 10, further comprising routing, by the test adapter, the test data within the integrated circuit based on the interpreted control information.

13. A method for testing an integrated circuit,comprising:
receiving, by the integrated circuit ,a packet containing test data for testing the integrated circuit;
extracting ,by a test adapter of the integrated circuit the test data from the packet;
transferring,by the test adapter,the extracted test data to scan chain logic of the integrated circuit;
packetizing ,by the test adapter,test results received from the scan chain logic for transmission to an automated test control system;

deserializing, by a serializer/deserializer(SERDES) of the integrated circuit, packetized test data received at an input port of the integrated circuit;

serializing, by the SERDES, packetized test results for transmission to an automated test control system; and switchably routing data to/from the SERDES and the test adapter, and to/from the SERDES and logic of the integrated circuitry coupled to the SERDES in parallel with the test adapter.

14. A method for testing an integrated circuit, comprising;

receiving, by the integrated circuit, a packet containing test data for testing the integrated circuit;

extracting, by a test adapter of the integrated circuit, the test data from the packet;

transferring, by the test adapter, the extracted test data to scan chain logic of the integrated circuit;

packetizing, test adapter, test results received from the scan chain logic for transmission to an automated test control system;

deserializings, by a serializer/deserializer (SERDES) of the integrated circuit, packetized test data received at an input port of the integrated circuit;

serializing, by the SERDES, packetized test results for transmission to an automated control system; and communicating control information to the test adapter through a test controller that provides communication with the test adapter through a channel other than that provided via the SERDES.

15. A test adapter for testing an integrated circuit, comprising:

a physical layer (PHY) unit configured to:
receive deserialized test data from a serializer/deserializer (SERDES);
descramble the received test data;
apply error correction to the received test data; and
frame the received test data;

a media access control (MAC) unit coupled to the physical layer unit, and
configured to decode packets of the received test data;

a control and data unit coupled to the MAC unit, and configured to:
interpret control information embedded in the decoded test data; and
route the test data within the integrated circuit based on the control information.

16. The test adapter of claim 15,
wherein the PHY unit is configured to:
frame test result data to be transmitted:
add error correction to the test result data; and
scramble the test result data;
wherein the MAC unit is configured to packetize the test result data.

17. The test adapter of claim 15, wherein the PHY unit is configured to receive deserialized test data at a rate of at least 3.25 giga-bits per second.

18. The test adapter of claim 15, further comprising routing logic coupled to the SERDES, the routing logic configured to switchably route data to/from the SERDES and the PHY unit, and to/from the SERDES and transceiver circuitry of the integrated circuitry coupled to the SERDES in parallel with the test adapter.

19. The test adapter of claim 15, further comprising a control port configured to provide communication with the control and data unit via a communication channel other than that provided through a port of the test adapter configured for connection to the SERDES.

20. The test adapter of claim 15 wherein the control and data unit is configured to interpret the control information as identifying a packet of the test data as
specifying at least one of:
a return address counter reset command;
a test adapter loop back command;
a control value command;
an automated test pattern generation (ATP) shift command;
ATPG stuck at capture command; and
an ATPG TFT capture command.

* * * * *